US012461446B2

United States Patent
Kobayashi

(10) Patent No.: US 12,461,446 B2
(45) Date of Patent: Nov. 4, 2025

(54) ILLUMINATION OPTICAL SYSTEM, EXPOSURE APPARATUS AND METHOD OF MANUFACTURING ARTICLE

(71) Applicant: CANON KABUSHIKI KAISHA, Tokyo (JP)

(72) Inventor: Daisuke Kobayashi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 752 days.

(21) Appl. No.: 17/733,021

(22) Filed: Apr. 29, 2022

(65) Prior Publication Data

US 2022/0357659 A1    Nov. 10, 2022

(30) Foreign Application Priority Data

May 7, 2021    (JP) .................................. 2021-079243

(51) Int. Cl.
  *G03F 7/20* (2006.01)
  *G02B 26/08* (2006.01)
  *G03F 7/00* (2006.01)

(52) U.S. Cl.
  CPC ......... *G03F 7/201* (2013.01); *G02B 26/0875* (2013.01); *G03F 7/7055* (2013.01)

(58) Field of Classification Search
  CPC .... G03F 7/201; G03F 7/7055; G03F 7/70191; G03F 7/70358; G03F 7/70558; G02B 26/0875; G02B 27/281; G02B 27/286
  See application file for complete search history.

(56) References Cited

U.S. PATENT DOCUMENTS 8,045,250 B1 * 10/2011 Gross ................. G02B 26/0841
                                                    359/209.1
10,018,834 B2 * 7/2018 Tsikouras .............. G01J 3/2823
(Continued)

FOREIGN PATENT DOCUMENTS

JP      2003-203853 A      7/2003
JP      2004111494 A       4/2004
(Continued)

OTHER PUBLICATIONS

Korean Office Action issued in corresponding KR Patent Application No. 10-2022-0051247, dated Dec. 9, 2024, with English translation.

(Continued)

*Primary Examiner* — Deoram Persaud
(74) *Attorney, Agent, or Firm* — Carter, DeLuca & Farrell LLP

(57) ABSTRACT

The present invention provides an illumination optical system for illuminating an object, comprising: a first light-transmissive member and a second light-transmissive member, and a control unit configured to control drive of the first light-transmissive member and the second light-transmissive member, therein, while the control unit drives the first light-transmissive member such that an incident angle of light to the first light-transmissive member increases, the control unit drives the second light-transmissive member such that the incident angle of light to the second light-transmissive member decreases, thereby changing the intensity of the light exiting from the illumination optical system.

17 Claims, 7 Drawing Sheets

(56) References Cited

U.S. PATENT DOCUMENTS

| | | |
|---|---|---|
| 11,165,978 B2 | 11/2021 | Kobuse et al. |
| 2006/0055834 A1* | 3/2006 | Tanitsu .............. G03B 27/42 349/5 |
| 2008/0030707 A1* | 2/2008 | Tanaka ............ G03F 7/70108 362/277 |
| 2009/0323043 A1* | 12/2009 | Dieckmann ........ G03F 7/70191 355/71 |
| 2010/0134775 A1* | 6/2010 | Takeuchi ........... G03F 7/70591 355/67 |
| 2012/0013877 A1 | 1/2012 | Tanaka |
| 2012/0170008 A1* | 7/2012 | Emoto .............. G03F 7/70725 355/53 |
| 2013/0169946 A1 | 7/2013 | Wu |
| 2015/0261101 A1* | 9/2015 | Shi .................. G03F 7/70558 355/67 |
| 2022/0171291 A1 | 6/2022 | Kobayashi |

FOREIGN PATENT DOCUMENTS

| | | |
|---|---|---|
| JP | 2012-142463 A | 7/2012 |
| JP | 2014-239088 A | 12/2014 |
| KR | 20120079009 A | 7/2012 |
| WO | 03/023832 A1 | 3/2003 |
| WO | 2010073794 A1 | 7/2010 |

OTHER PUBLICATIONS

Chinese Office Action issued by the China National Intellectual Property Administration on May 30, 2025 in corresponding CN Patent Application No. 202210471767.7, with English translation.
Notice of Allowance issued in corresponding KR Patent Application No. 10-2022-0051247, dated Jul. 25, 2025, with English translation.

\* cited by examiner

ILLUMINATION OPTICAL SYSTEM, EXPOSURE APPARATUS AND METHOD OF MANUFACTURING ARTICLE

BACKGROUND OF THE INVENTION

Field of the Invention

The present invention relates to an illumination optical system, an exposure apparatus and a method of manufacturing an article.

Description of the Related Art

As a lithography apparatus used in a manufacturing process of a semiconductor device or the like, there is known an exposure apparatus (so-called scanning exposure apparatus) that exposes a substrate while scanning an original and the substrate with respect to a projection optical system, thereby transferring the pattern of the original to the substrate. Such an exposure apparatus generally moves a substrate at a constant speed during scanning exposure of the substrate. However, to improve throughput (productivity), it is desirable accelerate and/or decelerate the substrate during scanning exposure. Japanese Patent Laid-Open No. 2012-142463 proposes a scanning exposure apparatus that performs scanning exposure of a substrate while accelerating and/or decelerating the substrate, thereby improving throughput.

If scanning exposure of a substrate is performed while accelerating and/or decelerating the substrate, as described in Japanese Patent Laid-Open No. 2012-142463, the exposure period may change in accordance with the speed of the substrate. For this reason, to make the exposure amount in scanning exposure constant (even), the illuminance of the substrate (that is, the intensity of light with which the substrate is irradiated) needs to be changed in accordance with the speed of the substrate. In Japanese Patent Laid-Open No. 2012-142463, the illuminance of the substrate is controlled by controlling a light source based on the driving profile of a substrate stage. However, there is the desire to control the illuminance of the substrate by a simpler method and mechanism.

SUMMARY OF THE INVENTION

The present invention provides, for example, a technique advantageous for changing the illuminance of a substrate in accordance with the speed of the substrate during scanning exposure.

According to one aspect of the present invention, there is provided an illumination optical system for illuminating an object, comprising: a first light-transmissive member and a second light-transmissive member, and a control unit configured to control drive of the first light-transmissive member and the second light-transmissive member, wherein, while the control unit drives the first light-transmissive member such that an incident angle of light to the first light-transmissive member increases, the control unit drives the second light-transmissive member such that the incident angle of light to the second light-transmissive member decreases, thereby changing the intensity of the light exiting from the illumination optical system.

Further features of the present invention will become apparent from the following description of exemplary embodiments with reference to the attached drawings.

DESCRIPTION OF THE EMBODIMENTS

Figure 1:
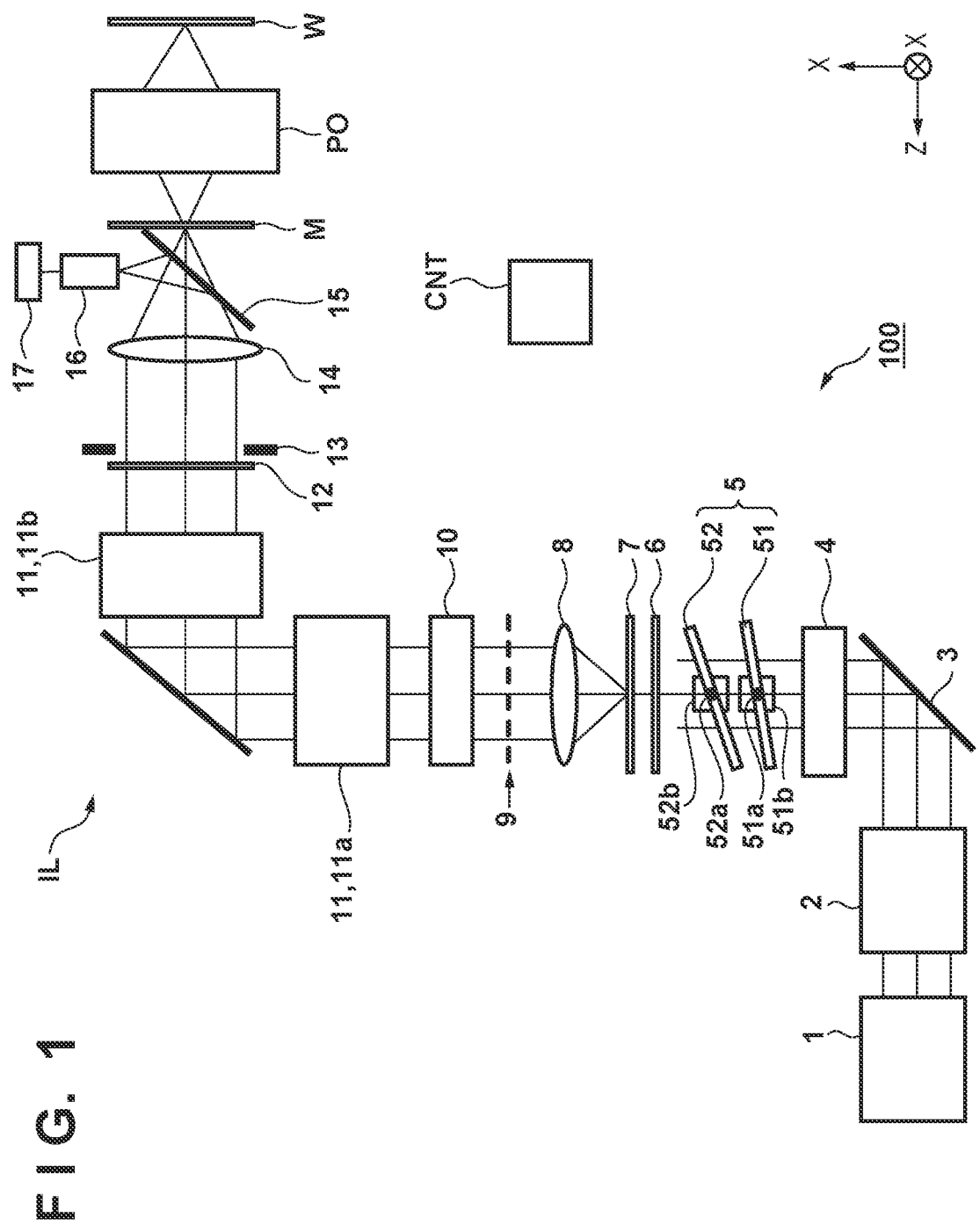
FIG. 1 is a schematic view showing an example of the configuration of an exposure apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

An exposure apparatus 100 according to the first embodiment of the present invention will be described. The exposure apparatus 100 according to this embodiment performs scanning exposure for exposing a substrate W while relatively scanning an original M and the substrate W arranged across a projection optical system PO, thereby transferring the pattern of the original M to the substrate. The scanning exposure can be performed for each of a plurality of shot regions of the substrate W. In the following description, a direction parallel to the optical axis of the projection optical system PO is defined as the Z direction, and two directions that are orthogonal to each other in a plane perpendicular to the Z direction are defined as the X direction and the Y direction.

[Configuration of Exposure Apparatus]

FIG. 1 is a schematic view showing an example of the configuration of the exposure apparatus 100 according to this embodiment. The exposure apparatus 100 can include an illumination optical system IL that illuminates the original M using a light beam from a light source 1, the projection optical system PO that projects the image of the pattern of the original M illuminated by the illumination optical system IL to the substrate W, and a controller CNT. The controller CNT is formed by, for example, a computer including a CPU, a memory, and the like, and controls the units of the exposure apparatus 100 (controls scanning exposure of the substrate W). Here, for example, a mask, a reticle, or the like can be used as the original M, and, for example, a wafer, a glass plate (liquid crystal substrate), or the like can be used as the substrate W.

The light source 1 emits a light beam (light) to expose the substrate W. The light source 1 according to this embodiment is configured (arranged) to make linearly polarized light (p-polarized light) enter a transmittance changing mechanism 5 to be described later. As an example, if a laser light source such as an excimer laser is used as the light source 1, light (laser beam) emitted from the laser light source is generally linearly polarized light, and therefore, the light source 1 can be arranged such that the linearly polarized light that enters the transmittance changing mechanism 5 becomes p-polarized light. On the other hand, if an LED or a mercury lamp is used as the light source 1, a polarizer configured to reduce s-polarized light can be provided in the light source 1 such that linearly polarized light (p-polarized light) enters the transmittance changing mechanism 5.

The illumination optical system IL can include a relay optical system 2, the transmittance changing mechanism 5, an exit angle preserving optical element 6, a diffraction optical element 7, a condenser lens 8, and a prism unit 10. The illumination optical system IL can further include a zoom lens unit 11, a multi beam generating unit 12, a diaphragm 13, and a condenser lens 14.

The relay optical system 2 is provided between the light source 1 and the exit angle preserving optical element 6, and guides the light beam emitted from the light source 1 to the exit angle preserving optical element 6. In this embodiment, the light beam that has exited from the relay optical system 2 is reflected by a mirror 3 and enters the illumination optical system IL via a plane-parallel plate 4. The position and the angle of the light beam entering the exit angle preserving optical element 6 can be adjusted by the mirror 3 and the plane-parallel plate 4.

The transmittance changing mechanism 5 can be arranged on the optical path between the light source 1 and the exit angle preserving optical element 6. The transmittance changing mechanism 5 is a mechanism configured to change the intensity of light that has exited from the illumination optical system IL (that is, the illuminance of light with which the original and/or the substrate is irradiated) in scanning exposure, and may be understood as a light-intensity changing mechanism or an illuminance changing mechanism. The transmittance changing mechanism 5 is configured to change the transmittance of light. The transmittance changing mechanism 5 passes, with a desired transmittance, light that has entered transmittance changing mechanism 5, thereby controlling the intensity of the light beam entering the exit angle preserving optical element 6 and controlling the intensity of light that exits from the illumination optical system IL. A detailed configuration of the transmittance changing mechanism 5 will be described later.

The exit angle preserving optical element 6 is an optical element configured to even the illuminance of the light beam with which the original M is irradiated, and can be arranged on the optical path on the light source side of the diffraction optical element 7 (that is, between the transmittance changing mechanism 5 and the diffraction optical element 7). The exit angle preserving optical element 6 includes an optical integrator such as a microlens array, a fiber bundle, or a fly-eye lens, and guides the light beam from the light source 1 to the diffraction optical element 7 while maintaining a predetermined divergence angle. This can reduce the influence of an output fluctuation of the light source 1 on a pattern distribution formed by the diffraction optical element 7.

The diffraction optical element 7 is arranged on the optical path between the exit angle preserving optical element 6 and the condenser lens 8, diffracts the light beam from the exit angle preserving optical element 6, and guides it to the condenser lens 8. The diffraction optical element 7 converts the light intensity distribution of the light beam from the light source 1 by the diffraction effect, thereby forming a desired light intensity distribution on the pupil plane of the illumination optical system IL, which is a plane conjugate to the pupil plane of the projection optical system PO, or on a plane conjugate to the pupil plane of the illumination optical system IL. A light source shape (light intensity distribution) formed on the pupil plane of the projection optical system PO in this way is called an effective light source shape. As the diffraction optical element 7, a CGH (Computer Generated Hologram) designed by a computer to obtain a desired diffraction pattern on a diffraction pattern plane may be used.

The condenser lens 8 is arranged on the optical path between the diffraction optical element 7 and the prism unit 10, and condenses the light beam diffracted by the diffraction optical element 7 to form a diffraction pattern on a Fourier transform plane 9. The Fourier transform plane 9 is a plane optically having a relationship of Fourier transform to the diffraction optical element 7 between the multi beam generating unit 12 (optical integrator) and the diffraction optical element 7. Hence, the shape of the diffraction pattern formed on the Fourier transform plane 9 can be changed by exchanging (changing) the diffraction optical element 7.

The prism unit 10 and the zoom lens unit 11 are arranged on the optical path between the Fourier transform plane 9 and the multi beam generating unit 12 (optical integrator), and function as a zoom optical system that enlarges the light intensity distribution formed on the Fourier transform plane 9. The prism unit 10 can adjust the annular ratio and the like of the diffraction pattern (light intensity distribution) formed on the Fourier transform plane 9 and guide the diffraction pattern to the zoom lens unit 11. The zoom lens unit 11 can be arranged on the optical path between the prism unit 10 and the multi beam generating unit 12 and include a first lens 11a and a second lens 11b. The zoom lens unit 11 can adjust the σ value of the diffraction pattern formed on the Fourier transform plane 9, which is based on the ratio of the NA (numerical aperture) of the illumination optical system IL and the NA (numerical aperture) of the projection optical system PO, and guide the diffraction pattern to the multi beam generating unit 12.

The multi beam generating unit 12 is provided on the optical path between the zoom lens unit 11 and the condenser lens 14, forms a lot of secondary light sources in accordance with the diffraction pattern with the adjusted annular ratio, numerical aperture, and σ value, and guides the secondary light sources to the condenser lens 14. The multi beam generating unit 12 can include a fly-eye lens as an optical integrator, and may include another optical integrator such as an optical pipe, a diffraction optical element, or a microlens array in place of or in addition to the fly-eye lens. When the multi beam generating unit 12 is provided, the original M that is a target illumination surface can evenly be illuminated with the light beam that has passed through the diffraction optical element 7. In addition, a diaphragm 13 is provided between the multi beam generating unit 12 and the condenser lens 14.

A half mirror 15 is provided at the subsequent stage of the light source 14, and some components of the light beam from the condenser lens 14 are guided to a detection unit 17 via an optical system 16. The detection unit 17 includes a sensor that detects the intensity of the incident light. Hence, the controller CNT can accurately control the exposure amount of the substrate W based on the detection result of the detection unit 17.

The original M is provided between the condenser lens 14 and the projection optical system PO, and has a circuit pattern to be transferred to the substrate. The original M is held and driven by an original stage (not shown). The projection optical system PO is provided between the original M and the substrate W, and maintains an optically conjugate relationship between the original M and the substrate W The substrate W is held and driven by a substrate stage (not shown). In the exposure apparatus 100 having the above-described configuration, a pattern can be formed on the substrate by performing so-called scanning exposure for projecting the image of the pattern of the original M illuminated by the illumination optical system IL to the substrate W via the projection optical system PO while scanning the original M and the substrate W.

Here, the substrate W includes a plurality of shot regions to which the pattern of the original M should be transferred, that is, for which scanning exposure should be executed. As for movement from one shot region to the next shot region, a reciprocal scanning operation is performed concerning the scanning direction. Concerning a direction orthogonal to the scanning direction, a step operation is performed from the end of scanning exposure of one shot region to the start of scanning exposure of the next shot region. Also, the resolution of the pattern of the original M depends on the effective light source shape, and the resolution of the pattern can be improved by forming an appropriate effective light source distribution.

[Scanning Exposure]

Figure 2:
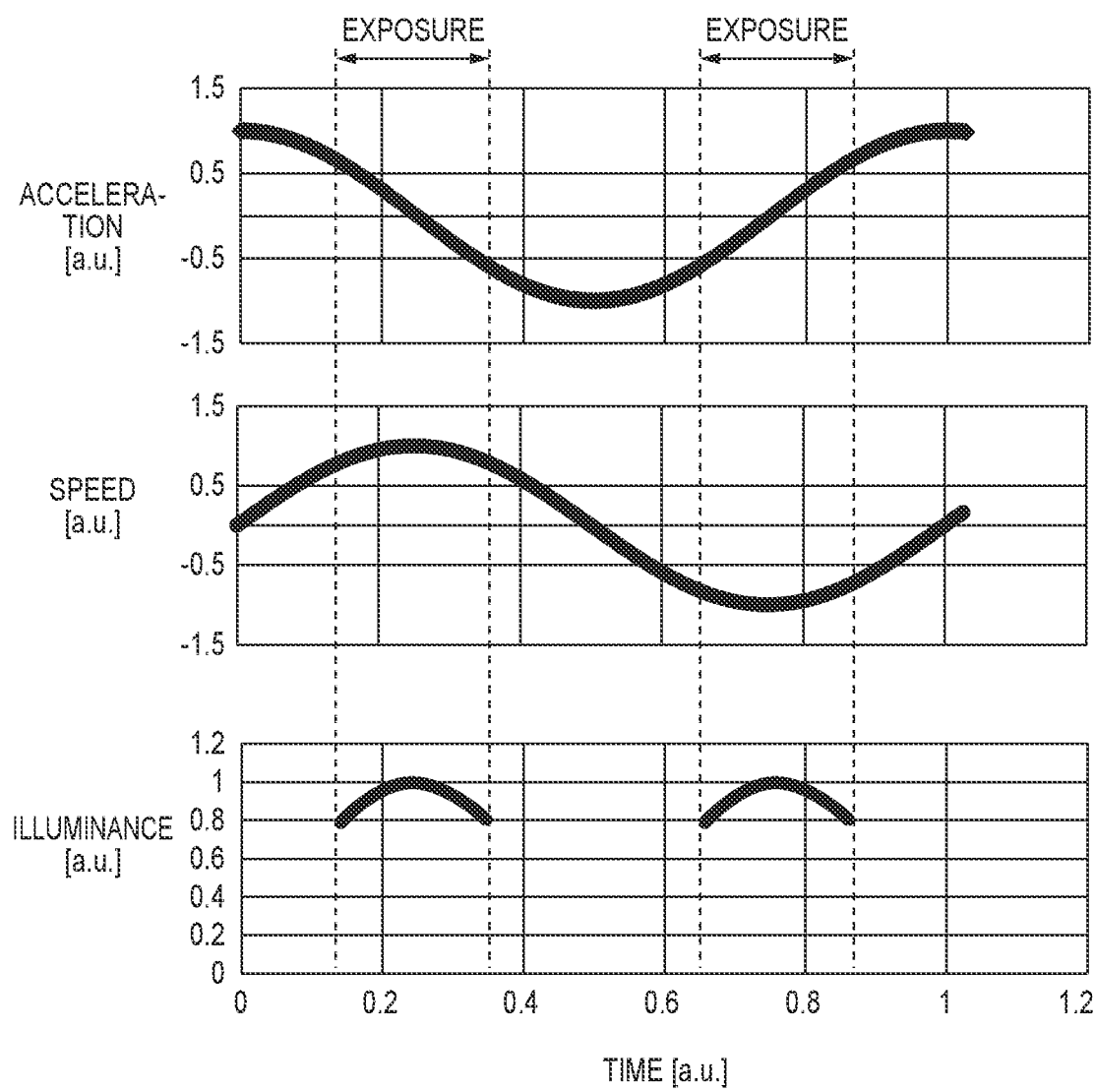
FIG. 2 is a view showing the acceleration, the speed, and the illuminance of a substrate when performing scanning exposure.

To improve throughput (productivity), the exposure apparatus 100 according to this embodiment controls scanning exposure such that an acceleration section where the substrate W is accelerated and a deceleration section where the substrate W is decelerated are included in the scanning exposure. For example, FIG. 2 shows the acceleration, the speed (velocity), and the illuminance of the substrate W when performing scanning exposure for each of the plurality of shot regions of the substrate W. As shown in FIG. 2, the exposure apparatus 100 drives the substrate W in accordance with a sine wave shaped speed profile, and scanning exposure of each shot region can be performed in a part of the speed profile, which includes an acceleration section and a deceleration section. That is, the speed of the substrate W in scanning exposure of each shot region can be defined by a part of the sine wave shaped speed profile, which includes an acceleration section and a deceleration section. The scanning exposure method can be called sine wave exposure.

In the scanning exposure including the acceleration section and the deceleration section, the exposure period changes in accordance with the speed of the substrate W at each position in a shot region in the scanning direction. For this reason, to make the exposure amount constant (even) at each position in the shot region, the illuminance of the substrate W (that is, the intensity of light with which the substrate W is irradiated) needs to be changed in a predetermined illuminance profile according to the speed of the substrate W. For example, in sine wave exposure, to make the exposure amount in scanning exposure constant, the illuminance of the substrate W is changed in accordance with a sine wave shaped illuminance profile according to the sine wave shaped speed of the substrate W, as shown in FIG. 2. In the example shown in FIG. 2, since scanning exposure is performed by changing the speed of the substrate W by 80% or more of the maximum speed, the illuminance of the substrate W is preferably changed sinusoidally such that it is increased from 80% to 100% and decreased from 100% to 80% to follow the change of the speed. In the exposure apparatus 100 according to this embodiment, the intensity of light exiting from the illumination optical system IL (to be sometimes referred to as the light intensity of the illumination optical system IL hereinafter) in scanning exposure is changed by the transmittance changing mechanism 5 in accordance with the speed of the substrate W, thereby changing the illuminance of the substrate W.

[Configuration of Transmittance Changing Mechanism]

An example of the configuration of the transmittance changing mechanism 5 will be described next. As shown in FIG. 1, the transmittance changing mechanism 5 according to this embodiment can include a first light-transmissive member 51 and a second light-transmissive member 52, which are arranged on the optical path. The first light-transmissive member 51 and the second light-transmissive member 52 are each formed by one plane-parallel plate and are arranged at an interval to each other in the optical axis direction. The first light-transmissive member 51 is configured to be rotatable by a first driving unit 51b about a first rotation axis 51a crossing the optical axis to change an angle θ1 (to be sometimes referred to as an incident angle θ1 hereinafter) made by the optical axis and a normal to the surface of the first light-transmissive member 51. Also, the second light-transmissive member 52 is configured to be rotatable by a second driving unit 52b about a second rotation axis 52a crossing the optical axis to change an angle θ2 (to be sometimes referred to as an incident angle θ2 hereinafter) made by the optical axis and a normal to the surface of the second light-transmissive member 52. Here, the first rotation axis 51a and the second rotation axis 52a are preferably perpendicular to the optical axis and are preferably parallel to each other. Furthermore, the first rotation axis 51a and the second rotation axis 52a are preferably set to be perpendicular to the plane of polarization (vibrating plane) of linearly polarized light that enters as p-polarized light into the transmittance changing mechanism 5 (the first light-transmissive member 51 and the second light-transmissive member 52).

Figure 3:
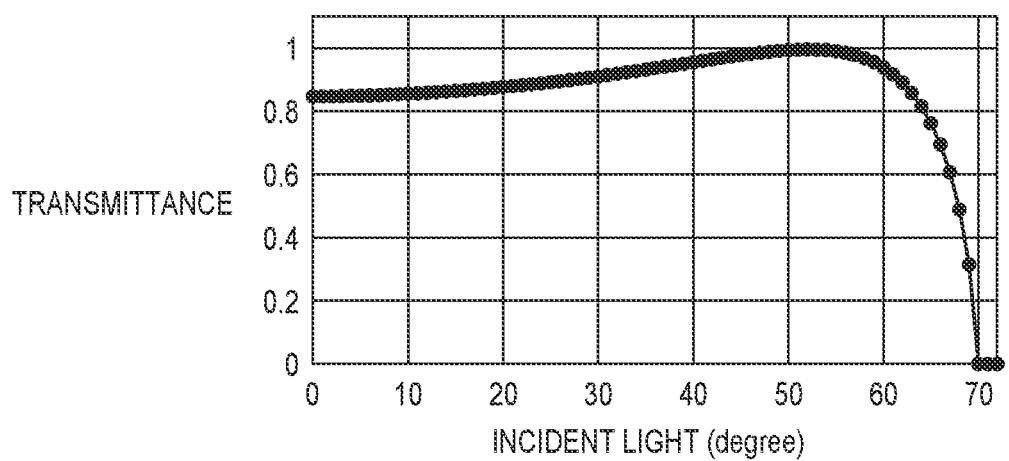
FIG. 3 is a graph showing the relationship between the incident angle and the transmittance of light (p-polarized light) on each of a first light-transmissive member and a second light-transmissive member.

From the viewpoint of facilitating control of the intensify of light exiting from the illumination optical system IL in scanning exposure, it is preferable that the first light-transmissive member 51 and the second light-transmissive member 52 are made of the same glass material and have transmittances of the same tendency. FIG. 3 shows the relationship between the incident angle and the transmittance of light (p-polarized light) on each of the first light-transmissive member 51 and the second light-transmissive member 52. FIG. 3 shows an example in which the first light-transmissive member 51 and the second light-transmissive member 52 are made of quartz. In this case, Brewster's angle is 56.5°. Brewster's angle is an incident angle when transmission light and reflected light are perpendicular. When the incident angle of p-polarized light is Brewster's angle, the transmittance of the p-polarized light is 100%.

The transmittance changing mechanism 5 configured as described above can change the light intensity of the illumination optical system IL by the first driving unit 51b driving (rotating) the first light-transmissive member 51 and the second driving unit 52b driving (rotating) the second light-transmissive member 52. Driving of the first light-transmissive member 51 and the second light-transmissive member 52 can be controlled by the controller CNT such that the light intensity of the illumination optical system IL in scanning exposure changes in a predetermined light intensity profile. The predetermined light intensity profile can be the profile of the light intensity of the illumination optical system IL, which is set such that the illuminance of the substrate W in scanning exposure changes in a predetermined illuminance profile (for example, the sine wave shaped illuminance profile shown in FIG. 2). In this embodiment, in scanning exposure, the controller CNT drives one of the light-transmissive members 51 and 52 such that the incident angle of light to the one increases within a first angle range. Also, in scanning exposure, the controller CNT drives the other of the light-transmissive members 51 and 52 in parallel to the driving of the one such that the incident angle of light to the other decreases within a second angle range. This can change the light intensity of the illumination optical system IL in a predetermined light intensity profile.

Here, each of the first angle range and the second angle range is set to include the Brewster's angle. The first angle range and the second angle range may be set to include a common angle range or may be set to the same angle range. Also, each of the first angle range and the second angle range may be set such that the Brewster's angle is the center angle. When the first angle range and the second angle range are set in this way, control of the light intensity of the illumination optical system IL can be facilitated, and the light intensity profile corresponding to the sine wave shaped illuminance profile shown in FIG. 2 can be implemented.

[Example of Driving of Light-Transmissive Members]

Figure 4A:
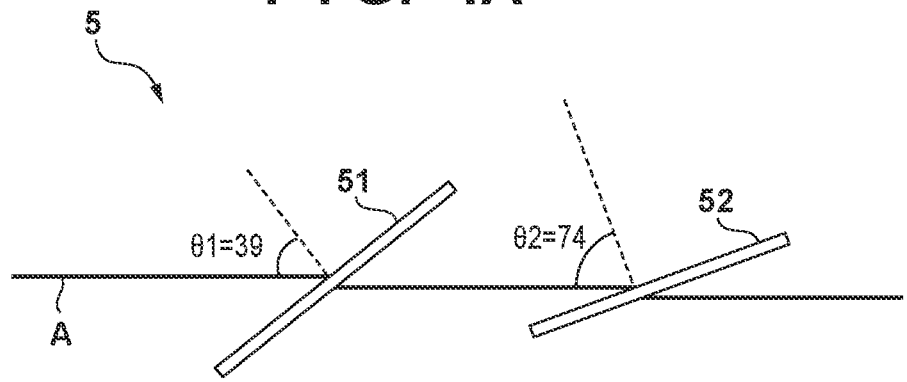
FIGS. 4A to 4C are views showing an example of driving of the first light-transmissive member and the second light-transmissive member in scanning exposure of one shot region.
Figure 4B:
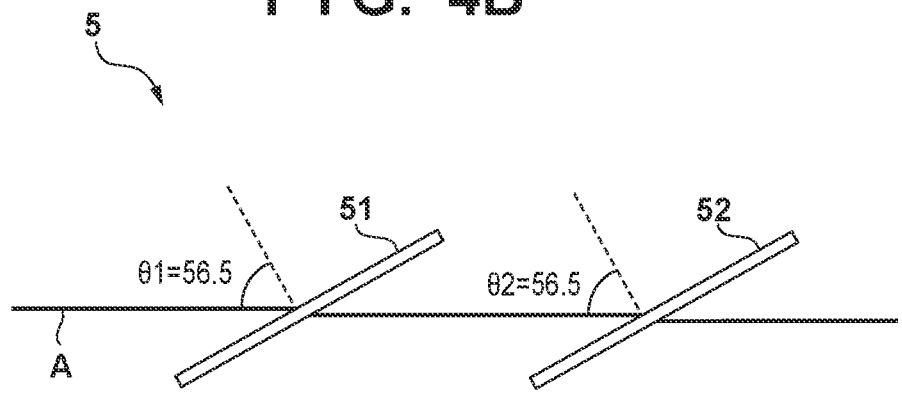
Figure 4C:
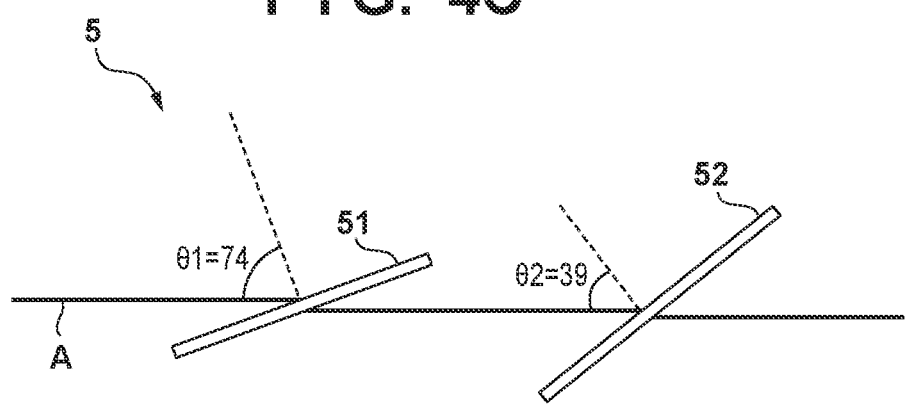

An example of driving of the first light-transmissive member 51 and the second light-transmissive member 52 will be described next. FIGS. 4A to 4C show an example of driving of the first light-transmissive member 51 and the second light-transmissive member 52 in scanning exposure (one scanning exposure) of one shot region. As described above, linearly polarized light (p-polarized light) enters the first light-transmissive member 51 and the second light-transmissive member 52. FIGS. 4A to 4C show an optical axis A (principal ray) of the linearly polarized light.

Figure 5:
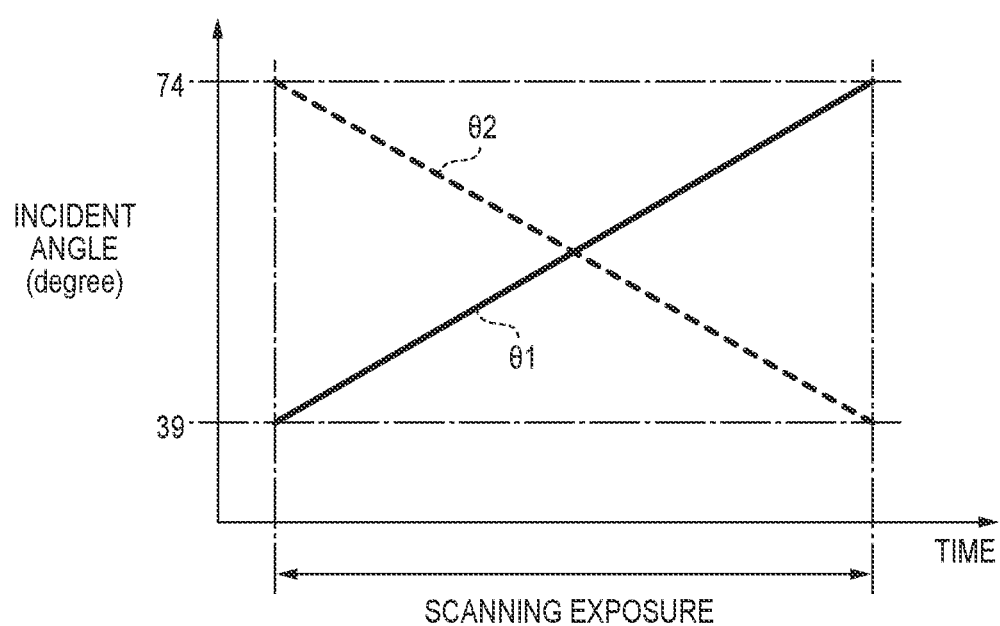
FIG. 5 is a view showing an example of control of the incident angle in scanning exposure of one shot region.

An example in which in one scanning exposure, the first light-transmissive member 51 is driven such that the incident angle θ1 increases within the first angle range, and the second light-transmissive member 52 is driven such that the incident angle θ2 decreases within the second angle range will be described here. The first angle range and the second angle range can each be set to a common angle range (39° to 74°) including the Brewster's angle (56.5°). Also, the first light-transmissive member 51 and the second light-transmissive member 52 can be driven such that the absolute value of the difference between the Brewster's angle and the incident angle θ1 of the light to the first light-transmissive member 51 equals the absolute value of the difference between the Brewster's angle and the incident angle θ2 of the light to the second light-transmissive member 52. For example, as shown in FIG. 5, in one scanning exposure, the first light-transmissive member 51 can be driven in one direction such that the incident angle θ1 linearly increases from 39° to 74°, and the second light-transmissive member 52 can be driven in one direction such that the incident angle θ2 linearly decreases from 74° to 39°. That is, the driving direction of the first light-transmissive member 51 and the driving direction of the second light-transmissive member 52 are not changed (inverted) during one scanning exposure.

FIG. 4A shows the arrangement of the first light-transmissive member 51 and the second light-transmissive member 52 at the start of scanning exposure. At the start of scanning exposure, the first light-transmissive member 51 is arranged such that the incident angle θ1 becomes 39°, and the second light-transmissive member 52 is arranged such that the incident angle θ2 becomes 74°. As the scanning exposure progresses, the first light-transmissive member 51 and the second light-transmissive member 52 are driven (rotated). FIG. 4B shows the arrangement of the first light-transmissive member 51 and the second light-transmissive member 52 when both the incident angle θ1 and the incident angle θ2 reach the Brewster's angle (56.5°) during scanning exposure. The controller CNT preferably controls driving of the first light-transmissive member 51 and the second light-transmissive member 52 such that the arrangement shown in FIG. 4B is obtained in a state in which the speed of the substrate W in the scanning exposure is the maximum speed. FIG. 4C shows the arrangement of the first light-transmissive member 51 and the second light-transmissive member 52 at the end of scanning exposure. At the end of scanning exposure, the first light-transmissive member 51 is arranged such that the incident angle θ1 becomes 74°, and the second light-transmissive member 52 is arranged such that the incident angle θ2 becomes 39°.

Here, in next scanning exposure, the driving direction of the first light-transmissive member 51 and the driving direction of the second light-transmissive member 52 are preferably inverted (reversed). More specifically, in next scanning exposure, the first light-transmissive member 51 can be driven such that the incident angle θ1 decreases within the first angle range, and the second light-transmissive member 52 can be driven such that the incident angle θ2 increases within the second angle range. This can obviate the necessity of returning the first light-transmissive member 51 and the second light-transmissive member 52 to the original arrangement every time scanning exposure is performed. It is therefore possible to simplify control of driving of the first light-transmissive member 51 and the second light-transmissive member 52. Note that inversion of the driving direction can be done during step movement of the substrate W, which is performed from the end of scanning exposure of one shot region to the start of next scanning exposure.

Figure 6A:
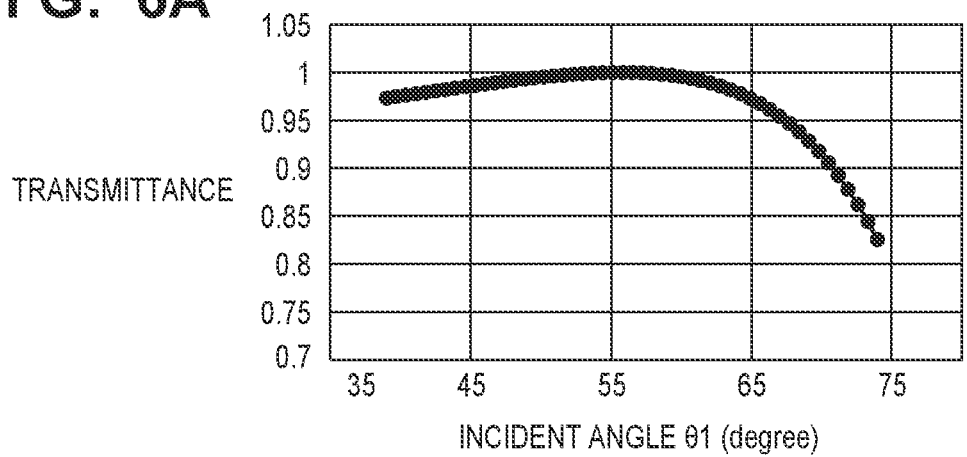
FIGS. 6A and 6B are graphs each showing a change of the transmittance of light in a transmittance changing mechanism.
Figure 6B:
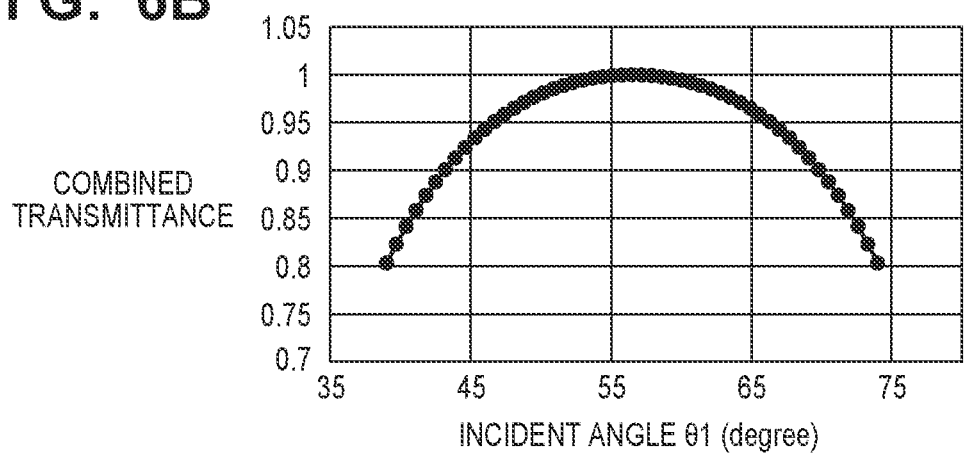

FIGS. 6A and 6B are graphs each showing a change of the transmittance of light in the transmittance changing mechanism 5.

FIG. 6A shows the transmittance characteristic (the relationship between the incident angle θ1 and the transmittance) of the first light-transmissive member 51 within the angle range of 39° to 74° (the first angle range and the second angle range). If the first light-transmissive member 51 and the second light-transmissive member 52 are made of the same glass material, the transmittance characteristic (the relationship between the incident angle θ2 and the transmittance) of the second light-transmissive member 52 also equals the characteristic shown in FIG. 6A, like the first light-transmissive member 51.

FIG. 6B shows a result of combining the transmittance of the first light-transmissive member 51 and the transmittance of the second light-transmissive member 52 (to be sometimes referred to as a combined transmittance hereinafter) within the angle range of 39° to 74°. In FIG. 6B, the abscissa represents the incident angle θ1 of light to the first light-transmissive member 51, and the ordinate represents the combined transmittance. As described above, the transmittance changing mechanism 5 according to this embodiment linearly increases the incident angle of light to one of the first light-transmissive member 51 and the second light-transmissive member 52 from 39° to 74°, and linearly decreases the incident angle of light to the other from 74° to 39° in scanning exposure. In this case, one of the incident angle θ1 and the incident angle θ2 becomes larger than the Brewster's angle (56.5°), and the other becomes smaller than the Brewster's angle. Also, the absolute values of the differences from the Brewster's angle equal each other. For this reason, the shape of the combined transmittance within the angle range can be laterally symmetrical with respect to the Brewster's angle as the axis of symmetry, and the light intensity profile of the illumination optical system IL corresponding to the illuminance profile shown in FIG. 2 can be implemented. Here, in the transmittance changing mechanism 5 according to this embodiment, when the angle range of each of the incident angle θ1 and the incident angle θ2 is changed, the light intensity profile of the illumination optical system IL can be changed. That is, the angle range can appropriately be changed in accordance with the target profile of the intensity of light exiting from the illumination optical system IL in scanning exposure.

[Shift Amount of Optical Axis]

The shift amount of the optical axis in the transmittance changing mechanism 5 will be described next. In this embodiment, the shift amount of the optical axis A can be defined as the difference between the optical axis of incident light that enters the light-transmissive member and the optical axis of transmission light that passes through the light-transmissive member and exits from the light-transmissive member. In addition, the variation (variation amount) of the optical axis A can be defined as the variation (variation amount) of the optical axis A of transmission light, which occurs when the light-transmissive member is driven (rotated) within a predetermined angle range (for example, 39° to 74°).

The first light-transmissive member 51 is formed by a plane-parallel plate. Hence, the shift amount of the optical axis A is generated in accordance with the incident angle θ1 of light to the first light-transmissive member 51, and when the incident angle θ1 is changed, the shift amount of the optical axis A can vary accordingly. Similarly, the second light-transmissive member 52 is also formed by a plane-parallel plate. Hence, the shift amount of the optical axis A is generated in accordance with the incident angle θ2 of light to the second light-transmissive member 52, and when the incident angle θ2 is changed, the shift amount of the optical axis A can vary accordingly.

In this embodiment, since the first light-transmissive member 51 and the second light-transmissive member 52 are used, the shift amount of the optical axis A by the first light-transmissive member 51 and the shift amount of the optical axis A by the second light-transmissive member 52 are combined (added). The combined shift amount is larger than the shift amount of the optical axis A in a single light-transmissive member. However, the variation of the combined shift amount, which is generated by driving the first light-transmissive member 51 and the second light-transmissive member 52 in the above-described way, is smaller than the variation of the shift amount of the optical axis A in the single light-transmissive member.

Figure 7:
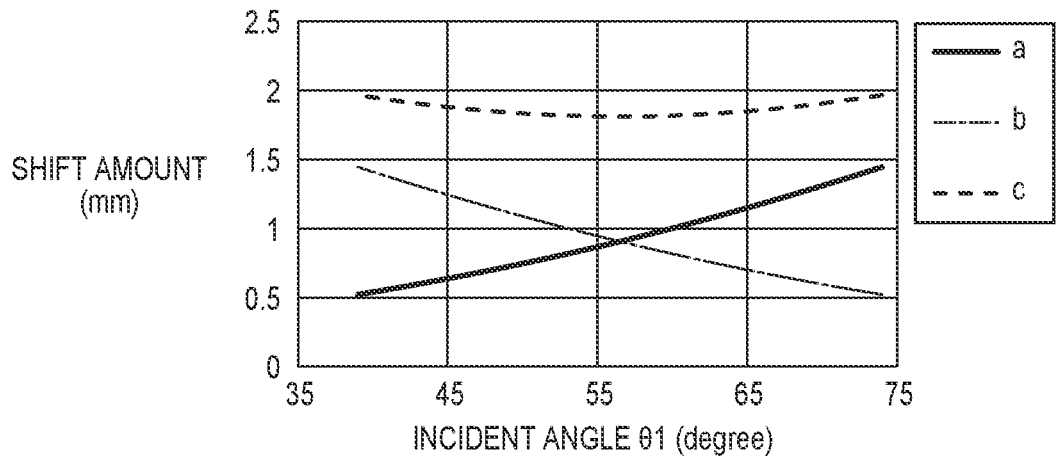
FIG. 7 is a graph showing the relationship between the incident angle and the shift amount of an optical axis A.

FIG. 7 shows the relationship between the incident angle of light and the shift amount of the optical axis A in a case in which both the first light-transmissive member 51 and the second light-transmissive member 52 have a thickness of 2 mm. The abscissa in FIG. 7 represents the angle range (39° to 74°) of the incident angle θ1 of light to the first light-transmissive member 51. The angle range of the incident angle θ2 of light to the second light-transmissive member 52 can be the angle range inverted (74° to 39°) along the abscissa. Also, in FIG. 7, a line (a) represents the shift amount of the optical axis A in the single first light-transmissive member 51, and a line (b) represents the shill amount of the optical axis A in the single second light-transmissive member 52. A line (c) represents the shift amount of the optical axis A in the entire transmittance changing mechanism 5, that is, the shift amount of the optical axis A when both the first light-transmissive member 51 and the second light-transmissive member 52 are used. The shift amount of the optical axis A indicated by the line (c) may be understood as a result of combining the shift amount of the optical axis A represented by the line (a) and the shift amount of the optical axis A represented by the line (b) (to be sometimes referred to as a combined shift amount hereinafter).

Referring to FIG. 7, if the incident angle θ1 is 39° (that is, if the incident angle θ2 is 74°), the shift amount of the optical axis A by the first light-transmissive member 51 is 0.52 mm, the shift amount of the optical axis A by the second light-transmissive member 52 is 1.45 mm, and the combined shift amount is 1.97 mm. Also, if both the incident angle θ1 and the incident angle θ2 are 56.5° (Brewster's angle), both the shift amount of the optical axis A by the first light-transmissive member 51 and the shift amount of the optical axis A by the second light-transmissive member 52 are 0.905 mm, and the combined shift amount is 1.81 mm. Furthermore, if the incident angle θ1 is 74° (that is, if the incident angle θ2 is 39°), the shift amount of the optical axis A by the first light-transmissive member 51 is 1.45 mm, the shift amount of the optical axis A by the second light-transmissive member 52 is 0.52 mm, and the combined shift amount is 1.97 mm.

As described above, in the single light-transmissive member (the first light-transmissive member 51 or the second light-transmissive member 52), the shift amount of the optical axis A can vary by 0.93 mm from 0.52 mm to 1.45 mm within the angle range of 39° to 74°. On the other hand, the combined shift amount is 1.89 mm on average, 1.81 mm at minimum, or 1.97 mm at maximum, and the variation can be suppressed to 0.16 mm within the angle range of 39° to 74°. That is, when the optical axis of the plane-parallel plate 4 and the optical axis of the exit angle preserving optical element 6 are arranged with a shift corresponding to the average combined shift amount of 1.89 mm, the variation amount of the optical axis, which is generated by driving of the first light-transmissive member 51 and the second light-transmissive member 52, can be suppressed to ±0.08 mm.

If the optical axis of light that enters the exit angle preserving optical element 6 varies, the light beam that enters the Fourier transform plane 9 tilts. The allowable amount of the variation of the optical axis of light that enters the exit angle preserving optical element 6 is ±0.5 mm. In the above-described example, the variation amount of the optical axis is ±0.08 mm, which is much smaller than the allowable amount (±0.5 mm). To increase rigidity, the first light-transmissive member 51 and the second light-transmissive member 52 may be thicker than 2 mm. The thickness of the light-transmissive members 51 and 52 is preferably set (decided) such that the variation amount of the optical axis is within the allowable amount (±0.5 mm).

As described above, in this embodiment, in one scanning exposure, one of the light-transmissive members 51 and 52 is driven such that the incident angle of light to the one increases within the first angle range, and the other is driven such that the incident angle of light to the other decreases within the second angle range. Each of the first angle range and the second angle range includes the Brewster's angle. Accordingly, in scanning exposure (for example, sine wave exposure) of one shot region, since the light intensity of the illumination optical system IL (that is, the illuminance of the substrate NV) can be changed in accordance with the speed of the substrate W, the exposure amount in the one shot region can be evened. Also, in this embodiment, in one scanning exposure, since the driving directions of the light-transmissive members 51 and 52 are not inverted, the load on motors (the first driving unit 51b and the second driving unit 52b) caused by the inversion can be reduced. That is, since the configuration of the transmittance changing mechanism 5 can be simplified (for example, the motors can be made compact), the apparatus can be prevented from becoming bulky. Note that although an example in which two light-transmissive members (the first light-transmissive member 51 and the second light-transmissive member 52) are used has been described above, three or more light-transmissive members may be used.

Second Embodiment

The second embodiment of the present invention will be described. In this embodiment, an example in which each of a first light-transmissive member 51 and a second light-transmissive member 52 is formed by a plurality of plane-parallel plates arranged with gaps along an optical axis A will be described. Note that this embodiment basically follows the first embodiment, and the configuration and processing of an exposure apparatus 100 (for example, the driving method of the first light-transmissive member 51 and the second light-transmissive member 52) are the same as described in the first embodiment.

Figure 8:
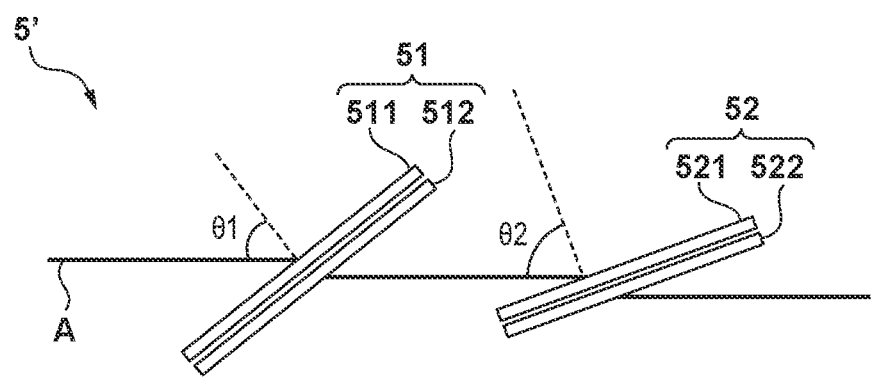
FIG. 8 is a view showing an example of the configuration of a transmittance changing mechanism according to the second embodiment.

FIG. 8 shows an example of the configuration of a transmittance changing mechanism 5' (the first light-transmissive member 51 and the second light-transmissive member 52) according to this embodiment. As shown in FIG. 8, the first light-transmissive member 51 is formed by two plane-parallel plates 511 and 512 arranged with a gap along the optical axis A, and the two plane-parallel plates 511 and 512 are integrally driven (rotated) by a first driving unit 51b. This can change an incident angle θ1 of light to the first light-transmissive member 51 (plane-parallel plate 511). In addition, the second light-transmissive member 52 is formed by two plane-parallel plates 521 and 522 arranged with a gap along the optical axis A, and the two plane-parallel plates 521 and 522 are integrally driven (rotated) by a second driving unit 52b. This can change an incident angle θ2 of light to the second light-transmissive member 52 (plane-parallel plate 521).

Figure 9:
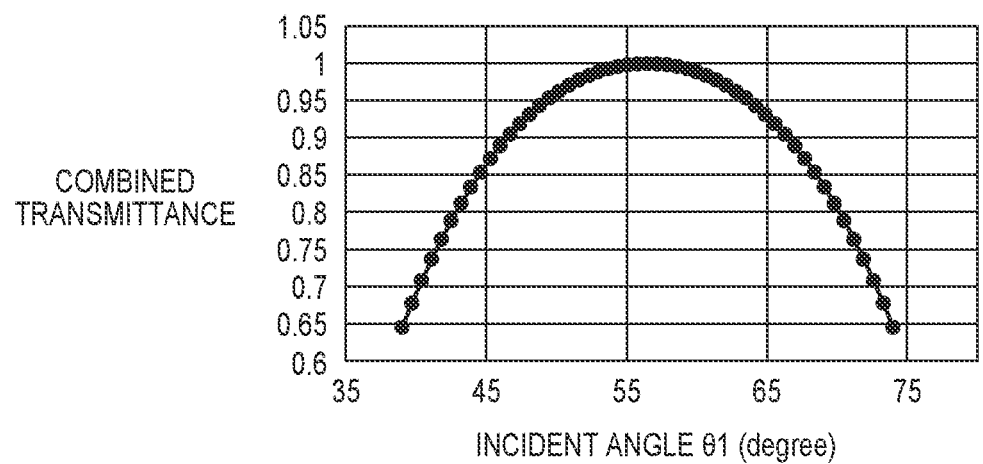
FIG. 9 is a graph showing a combined transmittance according to the second embodiment.

FIG. 9 shows a result of combining the transmittance of the first light-transmissive member 51 (plane-parallel plates 511 and 512) and the transmittance of the second light-transmissive member 52 (plane-parallel plates 521 and 522) (combined transmittance) within the angle range of 39° to 74°. As shown in FIG. 9, the transmittance changing mechanism 5' according to this embodiment can largely change (increase) the combined transmittance within the angle range of 39° to 74°, as compared to the transmittance changing mechanism 5 according to the first embodiment. In the transmittance changing mechanism 5' according to this embodiment, however, the variation amount of the optical axis is larger than in the transmittance changing mechanism 5 according to the first embodiment. Hence, the thickness of the plane-parallel plates 511 and 512, and 521 and 522 is preferably set (decided) such that the variation amount of the optical axis becomes equal to or smaller than the allowable amount (±0.5 mm).

As described above, in this embodiment, each of the first light-transmissive member 51 and the second light-transmissive member 52 is formed by a plurality of plane-parallel plates arranged with gaps along the optical axis. It is therefore possible to increase the combined transmittance of the first light-transmissive member 51 and the second light-transmissive member 52 within a predetermined angle range. Note that although an example in which each of the light-transmissive members 51 and 52 is formed by two plane-parallel plates has been described in this embodiment, each of the light-transmissive members 51 and 52 may be formed by three or more plane-parallel plates.

[Embodiment of Manufacturing Method of Article]

A method of manufacturing an article according to the embodiment of the present invention is suitable for manufacturing an article, for example, a microdevice such as a semiconductor device or an element having a microstructure. The method of manufacturing an article according to the embodiment includes a step of forming a latent pattern to a photosensitive agent applied onto a substrate (a step of exposing a substrate) by using the above-described exposure apparatus, and a step of developing (processing) the substrate on which the latent pattern has been formed in the forming step. Furthermore, this manufacturing method includes other well-known steps (for example, oxidization, deposition, vapor deposition, doping, planarization, etching, resist removal, dicing, bonding, packaging, and the like). The method of manufacturing an article according to the embodiment is advantageous in at least one of the performance, quality, productivity, and production cost of the article, as compared with a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-079243 filed on May 7, 2021, which is hereby incorporated by reference herein in its entirety.

What is claimed is:

1. An illumination optical system for illuminating an original using linearly polarized light that is p-polarized light, in scanning exposure of a substrate, comprising:
    a first light-transmissive member arranged on an optical path of the linearly polarized light, and
    a second light-transmissive member arranged on an optical path of the linearly polarized light which has been transmitted through the first light-transmissive member,
    wherein, in the scanning exposure:
        the substrate is scanned to be accelerated and then be decelerated,
        one of the first and second light-transmissive members is driven to increase a first incident angle at which the linearly polarized light is incident on the one, and the other of the first and second light-transmissive members is driven to decrease a second incident angle at which the linearly polarized light is incident on the other, and
        the first light-transmissive member and the second light-transmissive member are driven in accordance with a scanning speed of the substrate, such that each of the first incident angle and the second incident angle is a Brewster's angle when the scanning speed of the substrate is maximum.

2. The illumination optical system according to claim 1, wherein
    the first light-transmissive member is arranged on the optical path to be rotatable about a first rotation axis crossing an optical axis of the linearly polarized light, and
    the second light-transmissive member is arranged on the optical path to be rotatable about a second rotation axis crossing the optical axis.

3. The illumination optical system according to claim 2, wherein the first rotation axis and the second rotation axis are parallel.

4. The illumination optical system according to claim 1, wherein each of the first light-transmissive member and the second light-transmissive member is configured by one plane-parallel plate.

5. The illumination optical system according to claim 1, wherein each of the first light-transmissive member and the second light-transmissive member is configured by a plurality of plane-parallel plates arranged with gaps in an optical axis direction of the linearly polarized light.

6. The illumination optical system according to claim 1, further comprising:
    an optical integrator configured to even illuminance of the linearly polarized light with which the original is irradiated,
    wherein the first light-transmissive member and the second light-transmissive member are arranged on the optical path between a light source emitting the linearly polarized light and the optical integrator.

7. The illumination optical system according to claim 1, wherein a thicknesses of each of the first light-transmissive member and the second light-transmissive member is set such that a variation amount of an optical axis of the linearly polarized light generated by driving the first light-transmissive member and the second light-transmissive member is within ±0.5 mm.

8. The illumination optical system according to claim 1, wherein
    in the scanning exposure, the first light-transmissive member and the second light-transmissive member are driven in accordance with the scanning speed of the substrate, such that while the first incident angle increases within a first angle range, the second incident angle decreases within a second angle range, and
    each of the first angle range and the second angle range includes the Brewster's angle.

9. The illumination optical system according to claim 1, wherein in the scanning exposure, the first light-transmissive member and the second light-transmissive member are driven in accordance with the scanning speed of the substrate, such that an absolute value of a difference between the first incident angle and the Brewster's angle equals an absolute value of a difference between the second incident angle and the Brewster's angle.

10. The illumination optical system according to claim 1, wherein in the scanning exposure, the first light-transmissive member and the second light-transmissive member are driven in accordance with the scanning speed of the substrate, such that one of the first incident angle and the second incident angle is larger than the Brewster's angle, and the other of the first incident angle and the second incident angle is smaller than the Brewster's angle.

11. The illumination optical system according to claim 1, wherein in the scanning exposure, the first light-transmissive member and the second light-transmissive member are driven in accordance with the scanning speed of the substrate, such that an exposure amount on the substrate is constant.

12. An exposure apparatus for performing scanning exposure of a substrate, comprising:
    an illumination optical system configured to illuminate an original using linearly polarized light that is p-polarized light;
    a projection optical system configured to project an image of a pattern of the original to the substrate; and
    a control unit configured to control the illumination optical system,
    wherein the illumination optical system includes:
        a first light-transmissive member arranged on an optical path of the linearly polarized light, and
        a second light-transmissive member arranged on an optical path of the linearly polarized light which has been transmitted through the first light-transmissive member,
    wherein in the scanning exposure:
        the substrate is scanned to be accelerated and then be decelerated,
        one of the first and second light-transmissive members is driven to increase a first incident angle at which the linearly polarized light is incident on the one, and the other of the first and second light-transmissive members is driven to decrease a second incident angle at which the linearly polarized light is incident on the other, and
        the control unit drives the first light-transmissive member and the second light-transmissive member in accordance with a scanning speed of the substrate, such that each of the first incident angle and the second incident angle is a Brewster's angle when the scanning speed of the substrate is maximum.

13. The apparatus according to claim 12, wherein the control unit changes an intensity of light exiting from the illumination optical system in accordance with the scanning speed of the substrate in the scanning exposure, in the scanning exposure, the control unit drives first light-transmissive member and the second light-transmissive member in accordance with the scanning speed of the substrate, such that while the first incident angle increases within a first angle range, the second incident angle decreases within a second angle range, and each of the first angle range and the second angle range includes the Brewster's angle.

14. The apparatus according to claim 13, wherein the control unit does not change a driving direction of the first light-transmissive member and a driving direction of the second light-transmissive member during the scanning exposure.

15. The apparatus according to claim 13, wherein the scanning exposure includes an acceleration section where the substrate is accelerated and a deceleration section where the substrate is decelerated.

16. The apparatus according to claim 15, wherein speed of the substrate in the scanning exposure is defined by a part of a sine wave shaped speed profile, which includes the acceleration section and the deceleration section.

17. A method of manufacturing an article, the method comprising:

exposing a substrate using an exposure apparatus according to claim 12;

processing the substrate exposed in the exposing; and manufacturing the article from the substrate processed in the processing.

* * * * *